United States Patent [19]

Hoeft

[11] 3,761,741

[45] Sept. 25, 1973

[54] ELECTRICALLY VARIABLE IMPEDANCE UTILIZING THE BASE EMITTER JUNCTIONS OF TRANSISTORS

[75] Inventor: Werner H. Hoeft, San Jose, Calif.

[73] Assignee: Signetics Corporation, Sunnyvale, Calif.

[22] Filed: June 21, 1972

[21] Appl. No.: 265,217

[52] U.S. Cl. .................... 307/237, 323/79, 323/81, 328/172, 330/30 D, 330/69

[51] Int. Cl. .................... H03k 5/00

[58] Field of Search .................... 323/8, 9, 4, 22 T, 323/79, 81; 307/229, 230, 237, 254, 100; 330/30 D, 69; 328/146, 145, 172

[56] References Cited

UNITED STATES PATENTS

| | | | |
|---|---|---|---|
| 3,510,791 | 5/1970 | Nagata | 330/30 D |
| 3,673,508 | 6/1972 | Callahan, Jr. | 330/30 D |
| 3,310,688 | 3/1967 | Ditkofsky | 323/4 |
| 3,348,072 | 10/1967 | Marcus et al. | 307/229 X |
| 3,534,245 | 10/1970 | Limberg | 323/4 |
| 3,646,428 | 2/1972 | Torok | 323/8 |

*Primary Examiner*—Gerald Goldberg
*Attorney*—Paul D. Flehr et al.

[57] ABSTRACT

A variable impedance utilizing the diode characteristic of the base-emitter junction of a transistor. The voltage across the base-emitter stays constant so that a control voltage used to change the d.c. emitter current changes the impedance of the junction. When such a diode connected transistor shunts a signal line it attenuates the signal on the signal line. In order to reduce nonlinearities in impedance caused by application of the signal, a diode connected transistor has another transistor connected thereto in a differential circuit so that an increase in the emitter current (decrease in impedance) of one due to application of the signal causes a corresponding decrease in emitter current (and increase in impedance) of the other so that the nonlinearities cancel out. In another embodiment the two transistors are placed in the feedback loop of a differential amplifier with the impedance of the two transistors serving as the load for the differential amplifier, which further reduces nonlinearities. Several such transistor circuits may be connected in series to provide more junctions and hence a wider range of variable impedance.

11 Claims, 7 Drawing Figures

ELECTRICALLY VARIABLE IMPEDANCE UTILIZING THE BASE EMITTER JUNCTIONS OF TRANSISTORS

BACKGROUND OF THE INVENTION

This invention pertains to an electrically variable impedance and more particularly pertains to an electrically variable impedance utilizing the diode characteristics of base-emitter transistor junctions.

Accurate variable impedance control is necessary in many circuits. Multitrack volume control, automatic volume control, logarithmic amplification modulation and demodulation are but a few examples of circuits where such impedance control is necessary or desirable. Mechanical impedance control is known but has obvious disadvantages, especially in applications involving integrated circuits.

It is known in the prior art to use the base-emitter junction of a single transistor connected as a diode to form an electrically variable impedance. Such single transistor circuits have the disadvantage, however, of being extremely non-linear due to variations of impedance induced by the signal being attenuated. What is needed, therefore, is an electrically variable impedance which has a high degree of linearity.

OBJECTS AND SUMMARY OF THE INVENTION

It is therefore an object of this invention to provide an electrically variable impedance which has a high degree of linearity.

It is another object of this invention to provide an electrically variable impedance which has a wide range of variable impedance and which is substantially linear over the wide range of impedance.

Briefly, in accordance with one embodiment of the invention there is provided an electrically variable impedance shunting a signal line so as to attenuate a signal transmitted along the signal line. The electrically variable impedance comprises a diode connected transistor and an additional transistor. The two transistors are connected with their base-emitter junctions in series and oppositely poled with respect to each other. The impedance of the base-emitter junctions are set by emitter currents supplied by current source means. The emitter of the transistors are connected together so that a decrease in emitter current of one transistor causes an increase in emitter current of the other transistor. Thus a variation in impedance of one of the transistors induced by transmission of a signal down the signal line produces an opposite variation in impedance of the other transistor so as to reduce non-linearity in impedance of the thus formed electrically variable impedance.

DESCRIPTION OF THE PREFERRED EMBODIMENTS

Figure 1:
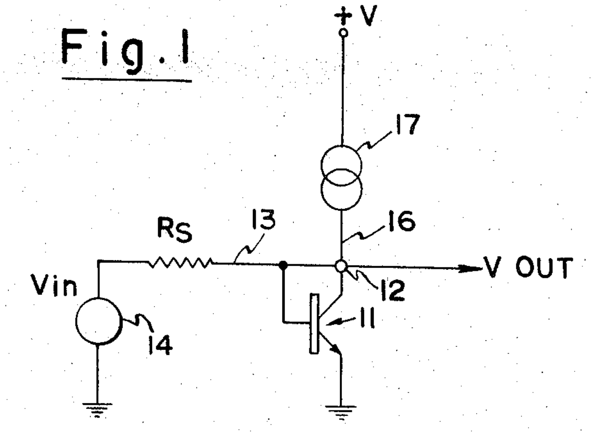
FIG. 1 is a schematic diagram of a basic electrically variable impedance comprising the base emitter junction of a diode connected transistor.

FIG. 1 is a schematic diagram of a basic electrically variable impedance comprising the base emitter junction of a diode connected transistor. A transistor 11 has base, emitter and collector electrodes. The emitter electrode is connected to ground and the base and collector electrodes are tied together at a terminal 12. The terminal 12 is in a signal line 13. The signal line 13 includes a signal source 14 supplying an input voltage $V_{in}$ and a series resistance $R_s$ connecting the signal source 14 to terminal 12. The output voltage $V_{out}$ is taken off of terminal 12. An impedance setting circuit 16 is provided which is connected to a bias voltage +V and includes a variable current source 17.

It is known that for a forward bias greater than a few tenths of a volt that the equation describing the diode characteristic of a base - emitter junction is given by $$R_D = k\ T/q\ I_E$$

where $R_D$ is the diode impedance, $k$ is Boltzman's constant, T is the Kelvin temperature, $q$ is the electronic charge, and $I_E$ is the emitter current. Thus the voltage drop across such a base emitter junction (given by $k\ T/q$) is constant for a given temperature. For room temperature (i.e., 25° C) this drop is equal to approximately 26 millivolts. Since this junction voltage does not change for a given temperature, the resistance or impedance $R_D$ can be varied by varying the emitter current $I_E$. Thus in FIG. 1 the current source 17 establishes some current through the base-emitter junction of transistor 11 which sets its resistance $R_D$ to a particular level. The signal from signal source 14 applied to terminal 12 via $R_s$ is thus attenuated by the ratio $R_s + R_D/R_D$. Theoretically, therefore, the output voltage $V_{out}$ is equal to $R_D/R_s + R_D$ times the input voltage $V_{in}$.

The circuit of FIG. 1 has, however, the deficiency of being highly non-linear due to the variation of impedance of transistor 11 induced by the input voltage from signal source 14. That is, application of this input or signal voltage affects the emitter current of transistor 11 which changes the impedance and so on. Measurements taken on actual circuits indicate that this non-linearity is as high as 30 percent.

Figure 2:
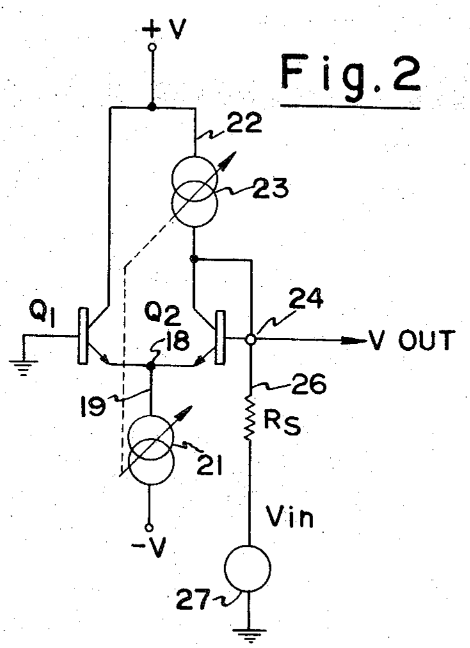
FIG. 2 is a schematic diagram of an improved electrically variable impedance in accordance with the invention using the base emitter junctions of two transistors connected so that nonlinearities in impedance tend to cancel out.

FIG. 2 is a schematic diagram of an improved electrically variable impedance in accordance with this invention which largely compensates for non-linearities induced by the input voltage. In FIG. 2 two transistors $Q_1$ and $Q_2$ are provided, each having base, emitter and collector electrodes. The emitters of transistors $Q_1$ and $Q_2$ are commonly connected at a terminal 18. A circuit 19 is also connected between terminal 18 and a source of bias voltage −V and includes a variable current source 21. The base of transistor $Q_1$ is connected to ground, the collector of transistor $Q_1$ is coupled to a source of bias voltage +V, while the base and collector of transistor $Q_2$ are coupied by means of circuit 22 including variable current source 23 to the +V source of bias voltage. The collector and base of transistor $Q_2$ are also ocmmonly connected to a terminal 24 from which an output voltage $V_{out}$ is taken and which might be termed the output terminal. A signal line 26 is connected to the terminal 24 and includes a signal source 27 and a series resistance $R_s$.

In the circuit of FIG. 2 the two base emitter junctions of transistors $Q_2$ and $Q_1$ are connected in series between terminal 24 and ground and function as a shunt resistance to signal line 26 for attenuating the signal $V_{in}$ from signal source 27. The two current sources 21 and 23 establish emitter currents through the base emitter junction of transistor $Q_1$ and the base emitter junction of transistor $Q_2$ which sets the shunt resistance formed by these two transistors to some particular value. When a signal is applied on the signal line 26 to terminal 24 it has the effect of increasing the current into the base of transistor $Q_2$, thus tending to lower the portion of the shunt impedance constituted by $Q_2$. This additional current flows out the emitter of transistor $Q_2$ into terminal 18. Since the current out of terminal 18 on circuit 19 is constant due to the current source 21, the current flowing into terminal 18 from the emitter of transistor $Q_1$ has to decrease in an amount equal to the increased current through $Q_2$. This current decrease through transistor $Q_1$ has the effect of increasing its impedance. Thus if the increase in impedance or resistance of transistor $Q_1$ is equal to the decrease in resistance of transistor $Q_2$ the total shunt impedance remains nearly the same and only a small amount of non-linearities are introduced due to transmission of a signal along signal line 26. In practice, the increase in impedance of one of the transistors is only going to be approximately equal to the decrease in impedance of the other when they are operated over a fairly narrow range. The improvement in linearity over the circuit of FIG. 1 due to the differential action of $Q_1$ and $Q_2$ is, however, quite significant. It should also be noted that by using two transistors as in FIG. 2 the impedance range has been doubled. That is, the shunt impedance constituted by transistors $Q_1$ and $Q_2$ is equal to 2 ($k$ T/$q$ $I_E$).

Figure 3:
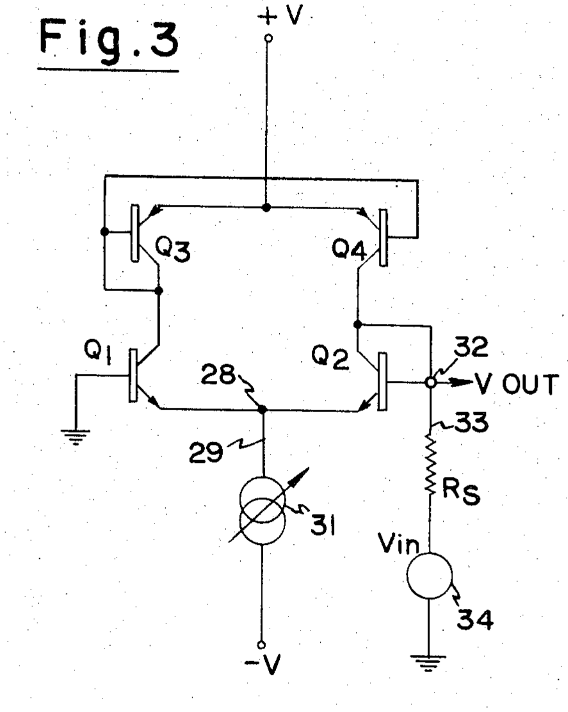
FIG. 3 is a schematic diagram of an improved electrically variable impedance in which the base-emitter junctions of two transistors connected as in FIG. 2 are placed in the feedback loop of a differential amplifier so as to further reduce nonlinearities.

FIG. 3 is a schematic circuit diagram of another embodiment of the invention which provides an ever further improvement in impedance linearity. In FIG. 3 two transistors $Q_1$ and $Q_2$ are provided, each having base, emitter and collector electrodes. The emitters of transistors $Q_1$ and $Q_2$ are commonly connected at a terminal 28. A circuit 29 is also connected between terminal 28 and a source of bias voltage −V and includes a variable current source 31. The base of transistor $Q_1$ is connected to ground and the base and collector of transistor $Q_2$ are commonly connected at a terminal 32. A signal line 33 is provided having a signal source 34 coupled through a series resistance $R_s$ to the terminal 32, from which the output voltage $V_{out}$ is taken. The collector of transistor $Q_1$ is connected to the base and collector of a transistor $Q_3$ and the collector of transistor $Q_2$ is connected to the collector of a transistor $Q_4$. The base of transistor $Q_4$ is connected to the base of transistor $Q_3$ and the emitters of both transistors $Q_3$ and $Q_4$ are commonly connected to a source of bias voltage +V.

The transistors $Q_3$ and $Q_4$ of FIG. 3 constitute a self-biasing differential amplifier with the output load of the differential amplifier consisting of the base-emitter impedances of $Q_1$ and $Q_2$ set by the current source 31. As shown in FIG. 3 the transistors $Q_3$ and $Q_4$ are of the NPN type whereas transistors $Q_1$ and $Q_2$ are of the PNP type. Alternatively, of course, the conductivity types could be reversed if the biasing polarities are reversed.

Non-linearity in the circuit of FIG. 3 is reduced by feedback through the differential amplifier comprised of transistors $Q_3$ and $Q_4$. Thus, for example, if the emitter current of $Q_1$ changes (which changes its resistance), the collector current of $Q_1$ changes an almost equal amount. The change of collector current will not be exactly equal to the change in emitter current because of the $\beta$ or base transport efficiency of transistor $Q_1$. The change in collector current of transistor $Q_1$ is coupled through transistors $Q_3$ and $Q_4$ to the base of transistor $Q_2$, thus changing the emitter current of transistor $Q_2$. A decrease in collector current of transistor $Q_1$ causes an increase in emitter current of transistor $Q_2$ and vice-versa. Thus non-linearities in impedance in the shunt circuit consisting of the base-emitter impedances of $Q_1$ and $Q_2$ tend to be reduced because of the differential effects of $Q_1$ and $Q_2$. The only non-linearity in the circuit of FIG. 3 is due to the variation of $\beta$ in the NPN transistor $Q_1$ and the variation of $\beta$ in the PNP transistors $Q_3$ and $Q_4$. That is all the emitter current change in transistor $Q_1$ is not coupled back to the base of transistor $Q_2$ due to the $\beta$ of transistors $Q_1$, $Q_3$ and $Q_4$. Again, the total shunt impedance comprised of transistors $Q_1$ and $Q_2$ is equal to 2 ($k$ T/$q$ $I_E$).

Figure 4:
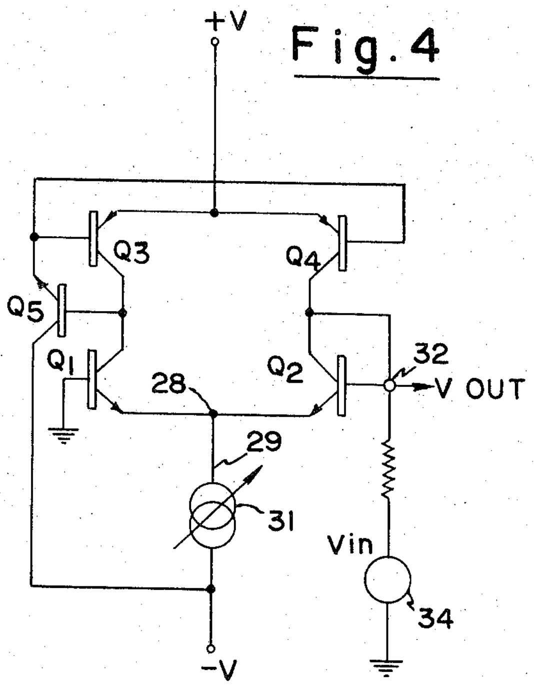
FIG. 4 is a schematic diagram of a circuit similar to FIG. 3 but including an additional transistor to compensate for current losses due to low Betas of the transistors in the differential amplifier of FIG. 3.

Turning now to FIG. 4, there is shown a schematic circuit diagram of a circuit similar to that of FIG. 3, but including an additional transistor to even further reduce nonlinearities. Circuit elements in the circuit of FIG. 4 are given the same reference designations as applied in FIG. 3. The only difference between the circuit of FIG. 3 and FIG. 4 is that in the circuit of FIG. 4 an additional PNP transistor $Q_5$ is provided which provides the base currents to transistors $Q_3$ and $Q_4$ so that the only loss in the circuit in coupling changes in emitter current in transistor $Q_1$ to the base of transistor $Q_2$ is that due to the $\beta$ of transistor $Q_1$ and the base current lost to transistor $Q_5$. A circuit in accordance with the invention such as shown in FIG. 4 is capable of operating over a wide impedance range with non-linearities limited to the order of 1.5 percent. The impedance range of the circuit of FIG. 4 is still determined by and limited to 2 ($k$ T/$q$ $I_E$).

Figure 5:
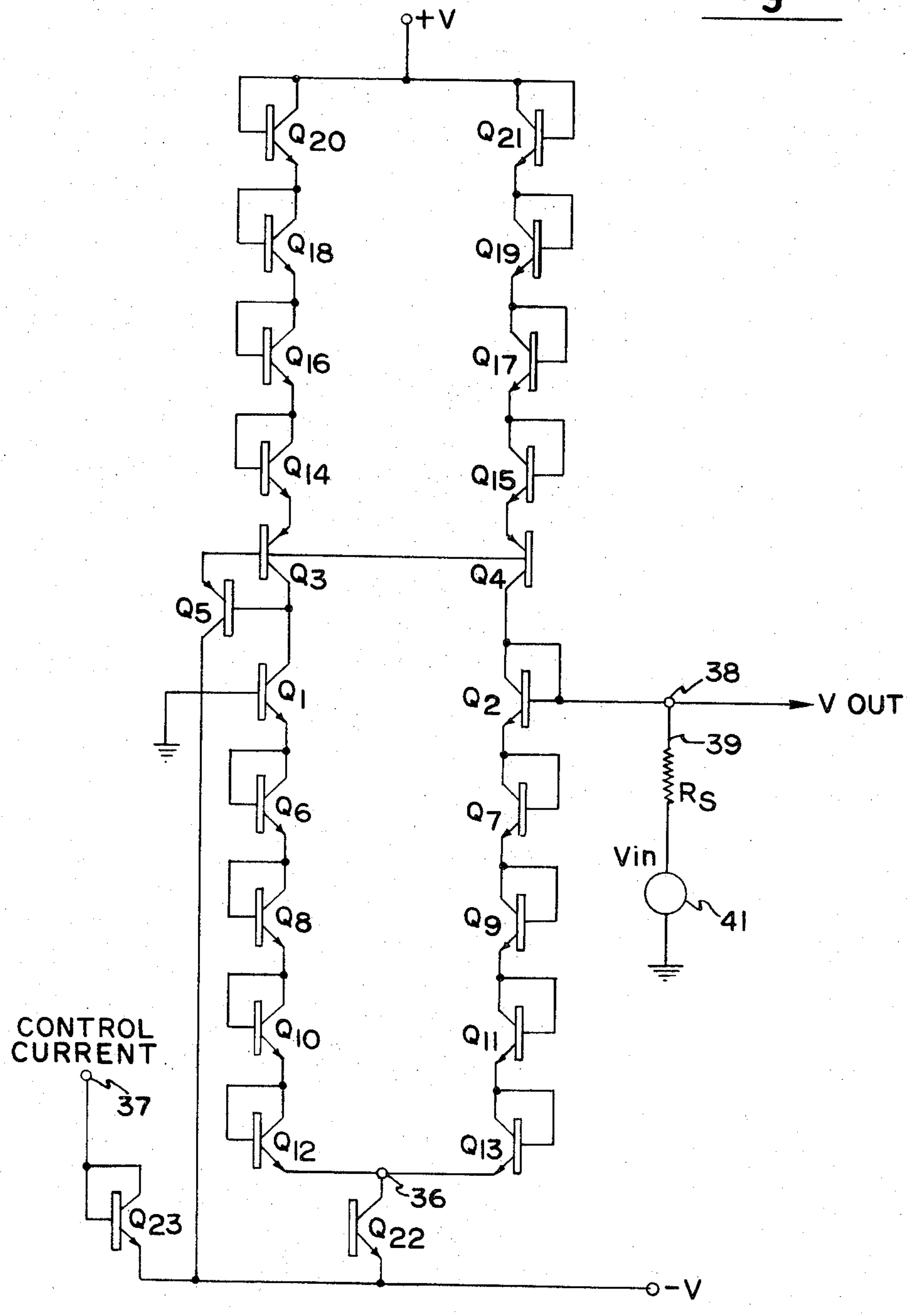
FIG. 5 is a schematic diagram of an electrically variable impedance utilizing a plurality of series connected base emitter junctions so as to increase the impedance range of the circuit.

FIG. 5 is a schematic circuit diagram of an embodiment of the invention utilizing a differential amplifier in which a plurality of diode connected transistors are connected in series to provide a larger value of electrically variable impedance or resistance. In FIG. 5 transistors $Q_1$, $Q_2$, $Q_3$, $Q_4$ and $Q_5$ are provided and function in the same manner as their like referenced counterparts in FIG. 4. Additional diode connected transistors $Q_6$, $Q_8$, $Q_{10}$ and $Q_{12}$ are connected in series between the emitter of $Q_1$ and a terminal 36. Likewise diode connected transistors $Q_7$, $Q_9$, $Q_{11}$ and $Q_{13}$ are connected in series between the emitter of $Q_2$ and terminal 36. Ten additional NPN diode connected transistors are also provided connected in series to the emitters of $Q_3$ and $Q_4$, five to the emitter of each transistor. A terminal 37 has a control current applied thereto which is coupled through transistors $Q_{23}$ and $Q_{22}$ to terminal 36 and serves to set the impedance or resistance of transistors $Q_1$, $Q_2$, $Q_6$, $Q_7$, $Q_8$, $Q_9$, $Q_{10}$, $Q_{11}$, $Q_{12}$ and $Q_{13}$. These ten transistors form an impedance connected to a terminal 38 and shunting signal line 39. Signal line 39 includes a signal source 41 coupled through resistance $R_s$ to the terminal 38. Since there are ten base emitter junctions connected in series, the total shunt impedance is equal to 10 $(k\ T/q\ I_E)$. The transistors $Q_{14}$, $Q_{15}$, $Q_{16}$, $Q_{17}$, $Q_{18}$, $Q_{19}$, $Q_{20}$ and $Q_{21}$ serve to keep the input impedance to transistor $Q_5$ as high as possible and provide a better controlled gain transfer between $Q_4$ and the load of the differential amplifier, which consists of the ten base-emitter impedances or resistances. This serves to maximize linearity. Inserting a plurality of base-emitter junctions of transistors in series as in FIG. 5 also permits higher output voltage swings at terminal 38. Thus, with the specific circuit of FIG. 5 an output voltage swing (at 25° C) of 20 times 26 millivolts or 520 millivolts peak to peak is realized. Additional diode connected transistors can be inserted for achieving even higher voltage swings.

Figure 6:
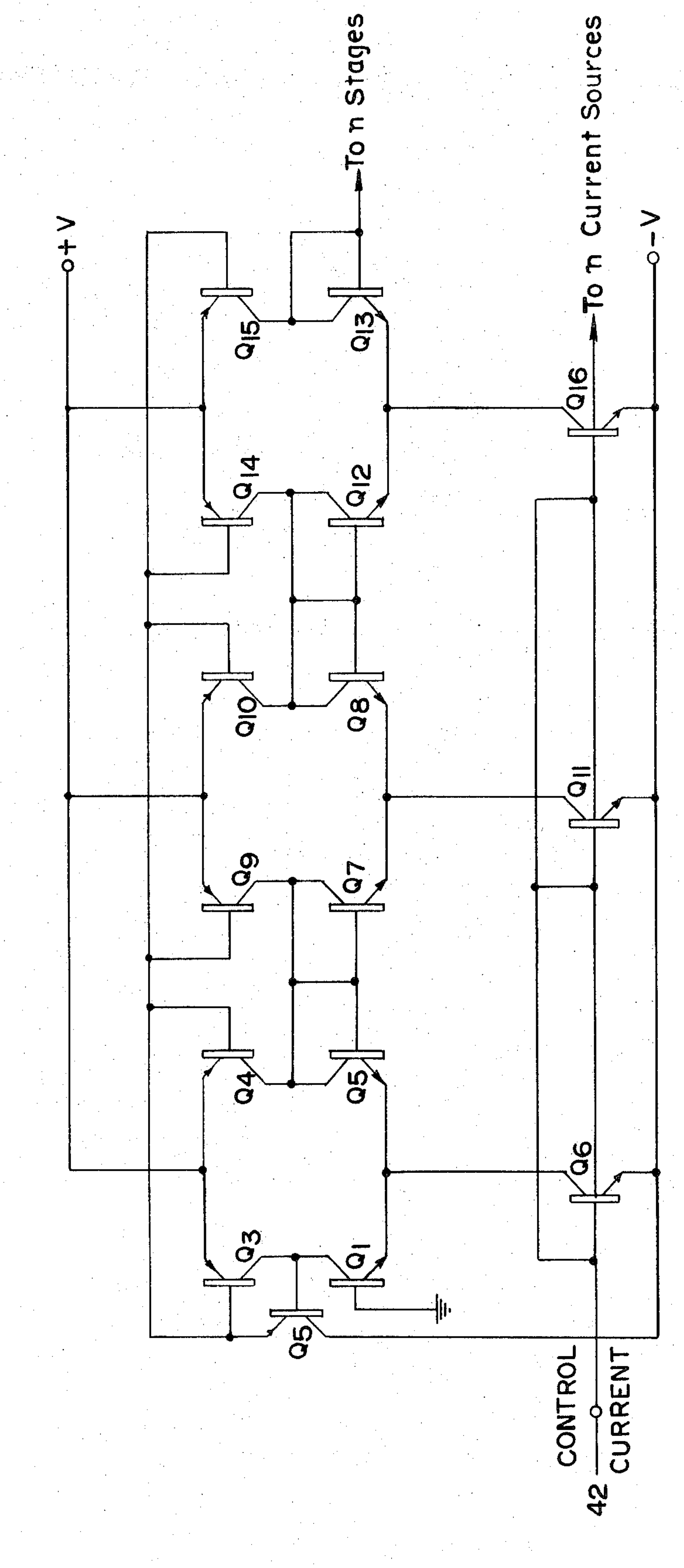
FIG. 6 is a schematic diagram of an electrically variable impedance which utilizes a plurality of series connected impedance stages, each impedance stage being somewhat similar to the circuit of FIG. 4.

FIG. 6 is a schematic circuit diagram of another embodiment of the invention for achieving a desired impedance range and output voltage swing. In the circuit of FIG. 6 a plurality of circuits such as shown in FIG. 4 are connected in series, with $\beta$ amplification for the PNP transistors in all the differential amplifiers, i.e., $Q_3$, $Q_4$, $Q_9$, $Q_{10}$, $Q_{14}$, $Q_{15}$, being provided by transistor $Q_5$. A control current is applied to a terminal 42 which through transistors $Q_6$, $Q_{11}$, $Q_{16}$, etc., sets the current level and hence the resistance of the base-emitter junction of the transistors $Q_1$ and $Q_2$, $Q_7$ and $Q_8$, and $Q_{12}$ and $Q_{13}$, etc., respectively. The output impedance of the circuit of FIG. 6 thus is equal to $2n\ (k\ T/q\ I_E)$ where $n$ is equal to the number of stages. Any number of stages can be assembled in this fashion, depending upon the impedance and voltage swing desired. Or circuits such as shown in FIG. 6 can be combined with circuits such as shown in FIG. 5.

Figure 7:
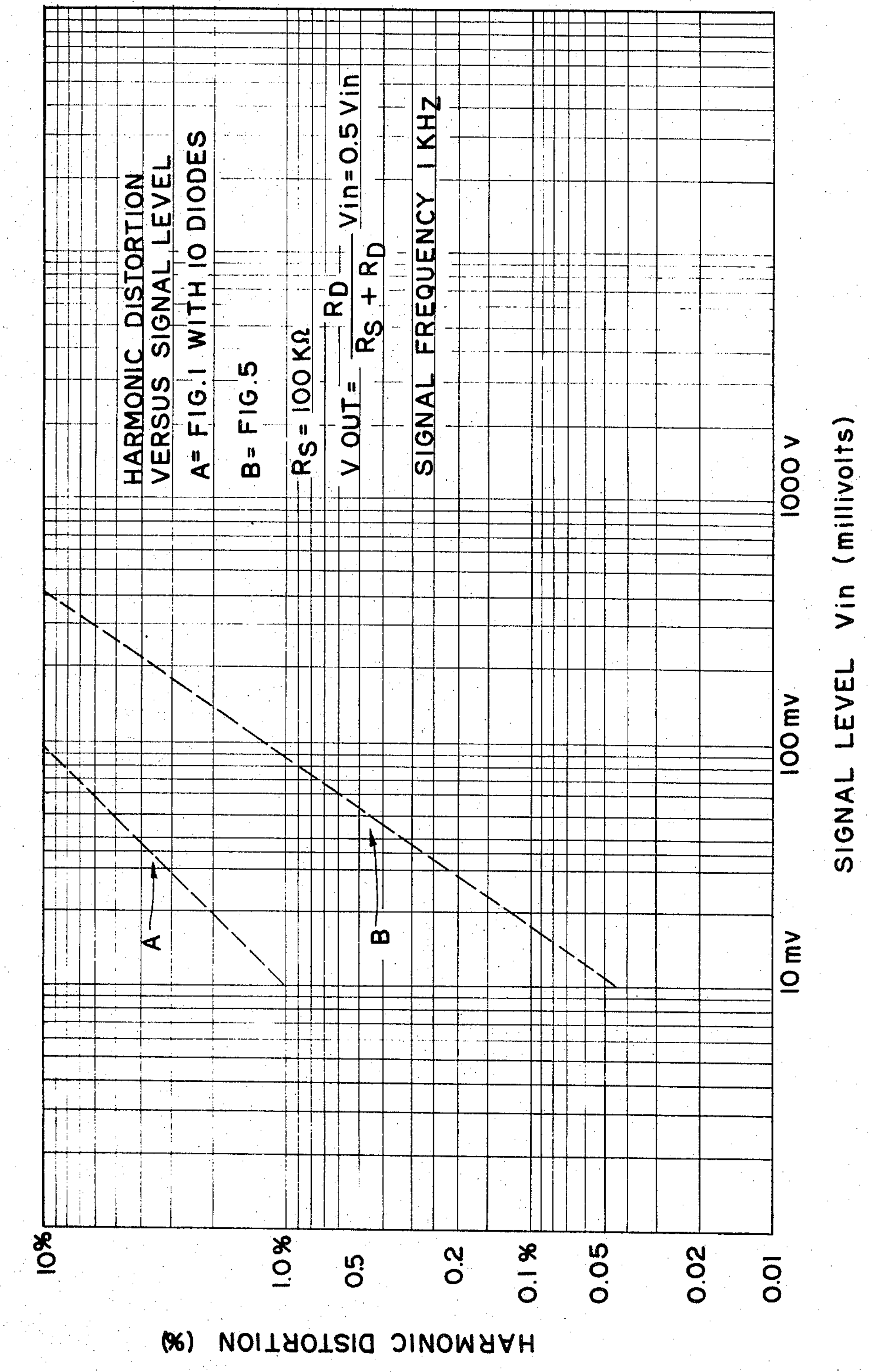
FIG. 7 is a graph drawn to logarithmic scale of harmonic distortion versus input signal level showing a comparison between a circuit in accordance with FIG. 1 but utilizING 10 diodes with a circuit such as shown in FIG. 5.

FIG. 7 is a graph drawn to logarithmic scale of harmonic distortion versus the input signal level of $V_{in}$ for a signal frequency of 1 KHz. The plot labeled A represents the harmonic distortion of a circuit such as shown in FIG. 1 except that 10 diode connected transistors were utilized. The value of $R_s$ was 100 K ohms and the variable diode impedance $R_D$ was also set to 100 K ohms so that $V_{out}$ was equal to 0.5 $V_{in}$. Maximum distortion or non-linearity occurs at this ratio between $V_{out}$ and $V_{in}$. As shown in FIG. 7 circuitry in accordance with FIG. 1 results in harmonic distortion of between 1 and 10 percent depending upon signal level. The plot labeled B represents the harmonic distortion of a circuit such as shown in FIG. 5 where the diode connected transistors are connected in a differential manner in the feedback path of an amplifier. As FIG. 7 shows, a significant improvement in linearity results with harmonic distortion for low signal levels on the order of 10 millivolts of only 0.45 per cent.

One important feature of the present invention should be pointed out. The control current for the variable current source can be shaped; that is, it need not be constant but can change according to some function. Thus, for example, by shaping the control current, any desired slope or changing impedance characteristic can be generated.

Thus what has been described is an improved electrically variable impedance in which non-linearities are minimized and in which a wide impedance range and wide voltage swing are possible. Although the invention has been described with reference to specific embodiments, it should be obvious to those skilled in the art that various modifications can be made to the specific embodiments disclosed herein without departing from the true spirit and scope of the invention.

I claim:

1. In a circuit including a signal line having a signal source and an output terminal, an electrically variable shunt impedance comprising first and second transistors each having base-emitter junctions, said base-emitter junctions connected in series with each other and to said output terminal, means for establishing emitter currents in said first and second transistors whereby their impedances are established, said base-emitter junctions of said first and second transistors being oppositely poled with respect to each other with their emitters commonly connected whereby an increase in emitter current of one of said first and second transistors due to the signal source causes an approximately equal decrease in emitter current of the other of said first and second transistors.

2. An electrically variable shunt impedance in accordance with claim 1 wherein said means for establishing emitter currents in said first and second transistors includes a current source connected to the emitters of said first and second transistors.

3. In a circuit including a signal line having a signal source and an output terminal, an electrically variable shunt impedance comprising first and second transistors each having base-emitter junctions, said base-emitter junctions connected in series with each other and to said output terminal and shunting the signal line, means for establishing emitter currents in said first and second transistors whereby their impedances are established, an amplifier having a feedback loop, said first and second transistors being in the feedback loop of said amplifier and constituting the load for the amplifier, said base-emitter junctions of said first and second transistors being oppositely poled with respect to each other with their emitters coupled together whereby an increase in emitter current of one of said first and second transistors due to the signal source is coupled through the amplifier to the other of the transistors to cause a decrease in the emitter current thereof.

4. An electrically variable shunt impedance in accordance with claim 3 wherein said means for establishing emitter currents in said first and second transistors comprises a current source connected to the emitters of said first and second transistors.

5. An electrically variable shunt impedance in accordance with claim 3 wherein said first and second transistors are of one conductivity type and wherein said amplifier comprises a self-biasing differential amplifier formed of third and fourth transistors of opposite conductivity type.

6. An electrically variable shunt impedance in accordance with claim 5 wherein the collector of said first transistor is connected to the base and collector of said third transistor and the base and collector of said second transistor is connected to the collector of said fourth transistor.

7. An electrically variable shunt impedance in accordance with claim 5 wherein the base and collector of said second transistor are connected to the collector of said fourth transistor and the collector of said first transistor is connected to the collector of said third transistor, and including a fifth transistor having its base connected to the collector of said first transistor and its emitter connected to the base of said third transistor, said fifth transistor functioning to provide base currents for said third and fourth transistors.

8. An electrically variable impedance in accordance with claim 5 wherein said current source is varied in accordance with a predetermined function in order to vary the shunt impedance and hence attenuation of a signal in accordance with that predetermined function.

9. An electrically variable impedance in accordance with claim 5 including a plurality of additional transistors of said one conductivity type connected with their base emitter junctions in series with said first and second transistors with one-half of said additional transistors being poled in the direction of said first transistor and one-half of said additional transistors being poled in the direction of said second transistor.

10. An electrically variable impedance in accordance with claim 9 including a plurality of transistors of said one conductivity type connected with their base emitter junctions in series with the emitter of said fourth transistor.

11. In a circuit including a signal line having a signal source and an output terminal, an electrically variable shunt impedance connected to said output terminal and comprising a plurality of series connected impedance stages, each impedance stage comprising first and second transistors each having base-emitter junctions, said base-emitter junctions connected in series, means for establishing emitter currents in said first and second transistors whereby their impedances are established, an amplifier having a feedback loop, said first and second transistors being in the feedback loop of said amplifier and constituting the load for the amplifier, said base-emitter junctions of said first and second transistors being oppositely poled with respect to each other with their emitters coupled together whereby an increase in emitter current of one of said first and second transistors due to the signal source is coupled through the amplifier to the other of the transistors to cause a decrease in the emitter current thereof.

* * * * *